(12) United States Patent
Jang et al.

(10) Patent No.: US 9,024,448 B2
(45) Date of Patent: May 5, 2015

(54) LOWER SEMICONDUCTOR MOLDING DIE, SEMICONDUCTOR PACKAGE, AND METHOD OF MANUFACTURING THE SEMICONDUCTOR PACKAGE

(71) Applicant: Samsung Electronics Co., Ltd., Suwon-si (KR)

(72) Inventors: Jae-Gwon Jang, Suwon-si (KR); Young-Lyong Kim, Gunpo-si (KR); Ae-Nee Jang, Gwangjin-gu (KR)

(73) Assignee: Samsung Electronics Co., Ltd. (KR)

( * ) Notice: Subject to any disclaimer, the term of this patent is extended or adjusted under 35 U.S.C. 154(b) by 130 days.

(21) Appl. No.: 13/785,675

(22) Filed: Mar. 5, 2013

(65) Prior Publication Data
US 2014/0021593 A1    Jan. 23, 2014

(30) Foreign Application Priority Data

Jul. 17, 2012   (KR) .................. 10-2012-0077861

(51) Int. Cl.
| | |
|---|---|
| H01L 23/48 | (2006.01) |
| H01L 23/495 | (2006.01) |
| H01L 21/56 | (2006.01) |
| H01L 23/13 | (2006.01) |

(52) U.S. Cl.
CPC ....... *H01L 23/49541* (2013.01); *H01L 2224/16* (2013.01); *H01L 21/561* (2013.01); *H01L 21/565* (2013.01); *H01L 23/13* (2013.01)

(58) Field of Classification Search
USPC .......................... 257/686, 734, 737, E23.069; 264/272.11, 272.17; 438/26, 127
See application file for complete search history.

(56) References Cited

U.S. PATENT DOCUMENTS

| | | | |
|---|---|---|---|
| 5,637,273 A | 6/1997 | Goo | |
| 6,652,799 B2 | 11/2003 | Seng et al. | |
| 6,855,280 B2 | 2/2005 | Hendry | |
| 7,758,787 B2 | 7/2010 | Grems et al. | |
| 7,910,044 B2 | 3/2011 | Steiner et al. | |
| 2012/0139109 A1* | 6/2012 | Choi ........................... | 257/738 |

FOREIGN PATENT DOCUMENTS

| | | |
|---|---|---|
| KR | 1999002590 | 1/1999 |
| KR | 19990025714 | 7/1999 |
| KR | 100298688 | 6/2001 |
| KR | 1020010064385 | 7/2001 |
| KR | 100448432 | 9/2004 |
| KR | 100627563 | 9/2006 |
| KR | 1020060123909 | 12/2006 |
| KR | 100711705 | 4/2007 |
| KR | 1020110135658 | 12/2011 |

* cited by examiner

*Primary Examiner* — Matthew W Such
*Assistant Examiner* — Krista Soderholm
(74) *Attorney, Agent, or Firm* — Onello & Mello, LLP.

(57) ABSTRACT

A semiconductor package may include a circuit board chip having a through-hole, a semiconductor device mounted on the circuit board chip, and an encapsulant. The encapsulant encapsulates the semiconductor device, fills the through-hole and has an external pattern that is the complement of a mold within which the encapsulant was formed. The external pattern on one side of the package reflects a mold shape that retards the flow of encapsulant material relative to the flow of encapsulant material on the opposite side of the package.

15 Claims, 13 Drawing Sheets

<u>401</u>

US 9,024,448 B2

LOWER SEMICONDUCTOR MOLDING DIE, SEMICONDUCTOR PACKAGE, AND METHOD OF MANUFACTURING THE SEMICONDUCTOR PACKAGE

This application claims priority from Korean Patent Application No. 10-2012-0077861 filed on Jul. 17, 2012 in the Korean Intellectual Property Office, the disclosure of which is incorporated herein by reference in its entirety.

BACKGROUND

1. Field of the Inventive Concept

Exemplary embodiments in accordance with principles of inventive concepts relate to a semiconductor package.

2. Description of the Related Art

Semiconductor integrated circuit devices may be assembled with circuit board chips, wire-bonded, encapsulated, and packaged to protect surfaces of the semiconductor device from external moisture and impurities and to dissipate heat from, for example, a bonding portion.

A semiconductor package may be fabricated by various processes using various members, including a lead frame, a printed circuit board (PCB), and a circuit film, for example. In particular, a semiconductor package may be fabricated using a bonding process, a wire process, and a molding process. In the molding process, a semiconductor molding apparatus may be used, for example, to encapsulate the semiconductor device. Encapsulation of the devices is critical to their performance and a system and method for effective encapsulation is therefore highly desirable.

SUMMARY

An exemplary embodiment of a semiconductor package molding die in accordance with principles of inventive concepts includes a mounting surface configured for receiving a plurality of circuit board chips, each having a through-hole and a plurality of window patterns, each aligned with a through-hole of a circuit board chip, each window pattern extending in a first direction under a corresponding one of the circuit board chips. Each of the window patterns comprises a first passage pattern having a first width and a second passage pattern having a second width different from the first width.

An exemplary embodiment of a semiconductor package molding die in accordance with principles of inventive concepts is configured for receiving an encapsulant which fills the through-hole and the window patterns.

An exemplary embodiment of a semiconductor package molding die in accordance with principles of inventive concepts includes a first passage pattern and the second passage pattern that are connected alternately in the first direction.

An exemplary embodiment of a semiconductor package molding die in accordance with principles of inventive concepts includes a second pattern width is greater than the first width.

An exemplary embodiment of a semiconductor package molding die in accordance with principles of inventive concepts includes a second passage pattern that is deeper than the first passage pattern.

An exemplary embodiment of a semiconductor package molding die in accordance with principles of inventive concepts includes a second passage pattern that is longer than the first passage pattern.

An exemplary embodiment of a semiconductor package molding die in accordance with principles of inventive concepts includes a first passage pattern that is disposed adjacent to an end of each of the circuit board chips, and a second passage pattern is disposed adjacent to a through-hole of each of the circuit board chips.

An exemplary embodiment of a semiconductor package molding die in accordance with principles of inventive concepts includes window patterns each of which includes a third passage pattern having a third width greater than the second width, wherein a third passage pattern is disposed adjacent to an end of each of the circuit board chips, a second passage pattern is disposed adjacent to the through-hole, and a first passage pattern is disposed between the second passage pattern and the third passage pattern.

An exemplary embodiment of a semiconductor package in accordance with principles of inventive concepts includes a circuit board chip having a through-hole, a semiconductor device mounted on the circuit board chip, and an encapsulant that encapsulates the semiconductor device, fills the through-hole, extends in a bottom surface of the circuit board chip in a first direction, and comprises a first bottom surface pattern having a first width and a second bottom surface pattern having a second width different from the first width.

An exemplary embodiment of a semiconductor package in accordance with principles of inventive concepts includes a first bottom surface pattern and a second bottom surface pattern that are connected alternately in a first direction.

An exemplary embodiment of a semiconductor package in accordance with principles of inventive concepts includes first and second bottom surface patterns of first and second widths, where the second width is greater than the first width.

An exemplary embodiment of a semiconductor package in accordance with principles of inventive concepts includes a second bottom surface pattern that is thicker than a first bottom surface pattern.

An exemplary embodiment of a semiconductor package in accordance with principles of inventive concepts includes a second bottom surface pattern that is longer than a first bottom surface pattern.

An exemplary embodiment of a semiconductor package in accordance with principles of inventive concepts includes a first bottom surface pattern that is disposed adjacent to an end of the circuit board chip, and the second bottom surface pattern is disposed adjacent to the through-hole.

An exemplary embodiment of a semiconductor package in accordance with principles of inventive concepts includes a third bottom surface pattern having a third width greater than the second width, wherein the third bottom surface pattern is disposed adjacent to both ends of the circuit board chip, the second bottom surface pattern is disposed adjacent to the through-hole, and the first bottom surface pattern is disposed between the second bottom surface pattern and the third bottom surface pattern.

An exemplary embodiment of a semiconductor package in accordance with principles of inventive concepts includes a circuit board chip having a through-hole, a semiconductor device mounted on the circuit board chip, and an encapsulant. The encapsulant encapsulates the semiconductor device, fills the through-hole and has an external pattern that is the complement of a mold within which the encapsulant was formed. The external pattern on one side of the package reflecting a mold shape that retards the flow of encapsulant material relative to the flow of encapsulant material on the opposite side of the package.

An exemplary embodiment of a semiconductor package in accordance with principles of inventive concepts includes an external pattern on one side that includes segments having different thicknesses.

An exemplary embodiment of a semiconductor package in accordance with principles of inventive concepts includes an external pattern on one side that includes segments having different widths.

An exemplary embodiment of a semiconductor package in accordance with principles of inventive concepts includes an external pattern on one side that includes a thicker segment aligned with the through-hole.

An exemplary embodiment of a semiconductor package in accordance with principles of inventive concepts includes an external pattern on one side that includes a wider segment aligned with the through-hole.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
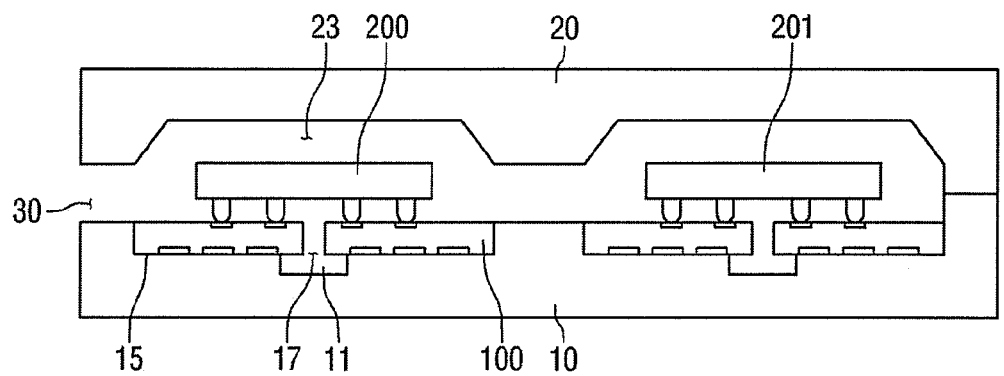
FIG. 1 is a cross-sectional view of an exemplary molding apparatus 1 in which a plurality of circuit board chips 100 are placed.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). The word "or" is used in an inclusive sense, unless otherwise indicated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

An exemplary embodiment of a semiconductor molding die in accordance with principles of inventive concepts will now be described in the discussion related to FIGS. 1 and 2.

FIG. 1 is a cross-sectional view of an exemplary embodiment of a molding apparatus 1 in accordance with principles of inventive concepts in which a plurality of circuit board chips 100 may be placed. FIG. 2 is a plan view of an exemplary embodiment of a plurality of window patterns 11, which may be recesses, for example, in accordance with principles of inventive concepts formed in a lower semiconductor molding die 10.

Referring to FIG. 1, the molding apparatus 1 in accordance with principles of inventive concepts includes an upper semiconductor molding die 20, a lower semiconductor molding die 10, and a runner 30.

Molding apparatus 1 in accordance with principles of inventive concepts may be employed in a molding process whereby an encapsulant is used to encapsulate, and thereby protect, a semiconductor device, a circuit board, etc. The encapsulation may protect circuit devices from various harms, such as corrosion by air or other environmental factors, may promote mechanical stability, and may effectively dissipate heat generated from a circuit board.

Referring again to FIG. 1, a cavity 23 may be formed on the underside of an upper semiconductor molding die 20 of the molding apparatus 1. During a molding process, an encapsulant may flow into the cavity 23 to encapsulate a semiconductor device 200. The volume of the cavity 23 may determine the volume of a finished, encapsulated, semiconductor product. The dimensions of the cavity 23 may vary according to the type, size and use of the semiconductor device 200, for example.

The lower semiconductor molding die 10 may include a window pattern 11 and a mounting surface 15. Each of the circuit board chips 100, upon which a semiconductor device 200 is placed, may be mounted on the mounting surface 15. The semiconductor device 200 may be a flip-chip, for example. The area of the mounting surface 15 may be equal to the area of a circuit board chip 100 and the depth of the mounting surface 15 may be equal to the thickness of a circuit board chip 100. In such an embodiment, the encapsulant may not reach the mounting surface 15 and may spread to all of the circuit board chips 100. In exemplary embodiments in accordance with principles of inventive concepts, the depth and area of the mounting surface 15 may vary to match the thickness and area of the circuit board chips 100.

In accordance with principles of inventive concepts, the window pattern 11 may be formed in the lower semiconductor molding die 10, for example, beneath mounting surface 15 of the lower semiconductor molding die 10. The window pattern 11 may be formed in the mounting surface 15 as a groove of a predetermined pattern, for example. Exemplary embodiments of one or more shapes of the window pattern 11 in accordance with principles of inventive concepts will be described in greater detail in the discussion related to the following Figs.

In exemplary embodiments in accordance with principles of inventive concepts, the runner 30 may be formed between the upper semiconductor molding die 20 and the lower semiconductor molding die 10. To encapsulate a semiconductor device 200, encapsulant material may be injected into the cavity 23 through the runner 30. In addition to encapsulating semiconductor devices 200, excess encapsulant material may be discharged through the window pattern 11 via a through-hole 17 formed in each of the circuit board chips 100.

In accordance with principles of inventive concepts, the window pattern 11 may located under through-hole 17, formed in each of the circuit board chips 100. In accordance with principles of inventive concepts, the each of the circuit board chips 100 closely mates with mounting surface 15 of the lower semiconductor molding die 10, leaving no gap between the edge of the circuit board chip 100 and the surrounding mounting surface 15 sufficient to allow the introduction of encapsulant material. With the window pattern 11 under the through-hole 17 and a tight seal between the circuit board chip 100 and the surrounding mounting surface 15, the encapsulant and the air inside the cavity 23 may be forced through through-hole 17 and discharged. The through-hole 17 may be employed to encapsulate the semiconductor device 200 using the encapsulant and may be used in, for example, a molded underfill (MUF) process. In particular, in a MUF process, a bottom surface of the semiconductor device 200 is encapsulated, and through-hole 17, in combination with window pattern 11 may be used to encapsulate the bottom surface of semiconductor device 200. Thus, in accordance with principles of inventive concepts, each of the circuit board chips 100 may include a through-hole 17, which serves as a passage for the encapsulant, so that the encapsulant can cover the bottom surface of the semiconductor device 200. Additionally, in accordance with principles of inventive concepts, the window pattern 11 disposed under the through-hole 17 allows encapsulant and the air inside the cavity 23 to be discharged. In exemplary embodiments in accordance with principles of inventive concepts, the encapsulant may fill the cavity 23, the through-hole 17, and the window pattern 11 of the molding apparatus 1. That is, in accordance with principles of inventive concepts, the window pattern 11 may operate as a passage through which the air inside the cavity 23 and the encapsulant may be discharged, thus allowing the semiconductor device 200 to be completely encapsulated with encapsulant material. In an exemplary embodiment in accordance with principles of inventive concepts, the window pattern 11 may be formed in a position that falls underneath the through-hole 17 of a circuit board chip 100 as the chip 100 is positioned on the mounting surface 15. In an exemplary embodiment in accordance with principles of inventive concepts, the through-hole, when positioned, may be aligned substantially with the center of a window pattern 11 segment beneath a circuit board chip 100.

An exemplary embodiment of a window pattern 11 in accordance with principles of inventive concepts will now be described with reference to FIG. 2. As described in the discussion related to FIG. 1, a semiconductor device 200 may be mounted on each of the circuit board chips 100 and the combination thereof mounted on mounting surface 15. However, semiconductor devices 200 and circuit board chips 100 are omitted from FIG. 2 for clarity and ease of description.

Figure 2:
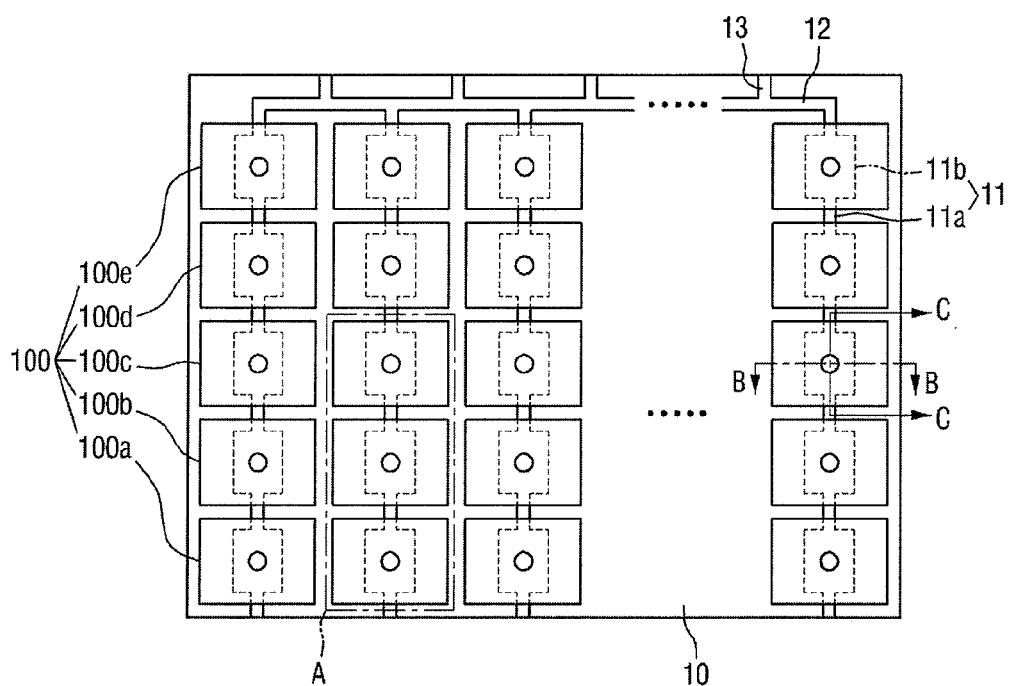
FIG. 2 is a plan view of a plurality of window patterns 11 of a lower semiconductor molding die 10 in accordance with principles of inventive concepts.

Referring to FIG. 2, the lower semiconductor molding die 10 may include a plurality of window patterns 11, a reservoir 12, and at least one vent 13. A plurality of circuit board chips 100 may be mounted on the mounting surfaces 15 over window patterns 11, as previously described. Because a plurality of semiconductor packages can be fabricated using one molding apparatus 1, the lower semiconductor molding die 10 may include one or more window patterns 11. The window patterns 11 may extend in a first direction from runner 30 toward reservoir 12 and may be connected to the reservoir 12. The reservoir 12 may be connected to at least one vent 13. When the vent 13 is put in a vacuum, the reservoir 12 and the window patterns 11, which structurally communicate with vent 13 are also subjected to vacuum and, as a result, encapsulant injected into the molding apparatus 1 through runner 30 flows the length of window patterns 11, encapsulating semiconductor devices 200 and circuit board chips 100 along the way, with excess encapsulant discharged through the vent 13.

In the exemplary embodiment in accordance with principles of inventive concepts depicted in FIG. 2, circuit board chips 100 may include first through fifth circuit board chips 100a through 100e. In a subsequent, post-encapsulation process, the first through fifth circuit board chips 100a through 100e may be separated from each other to form finished semiconductor chips, respectively.

Each of the window patterns 11 in an exemplary embodiment in accordance with principles of inventive concepts includes a first passage pattern 11a (also referred to herein as first passage pattern segment 11a) and a second passage pattern 11b (also referred to herein as a second passage pattern segment 11b), the different passage patterns 11a and 11b having different widths. The first passage pattern 11a and the second passage pattern 11b may be connected alternately (that is, with a first pattern 11a, followed by a second pattern 11b, followed by a first pattern, etc.) in the first direction to form each window pattern 11.

Referring again to FIG. 2, in an exemplary embodiment in accordance with principles of inventive concepts, circuit board chips 100 (and semiconductor devices 200 mated thereto) may be disposed over the window patterns 11 with one or more second passage patterns 11b disposed under each circuit board chip 100, for example.

Figure 3:
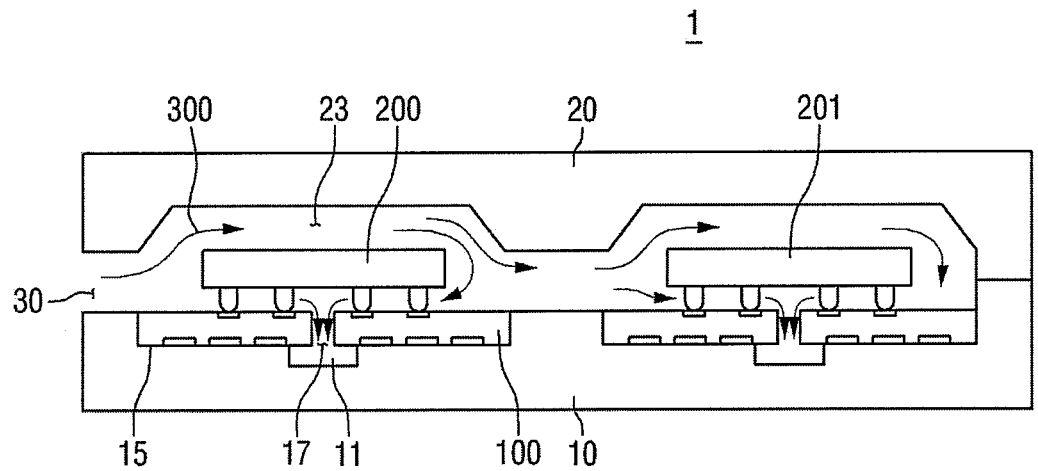
FIG. 3 is a cross-sectional view of the exemplary molding apparatus 1 during an exemplary molding process.
Figure 4:
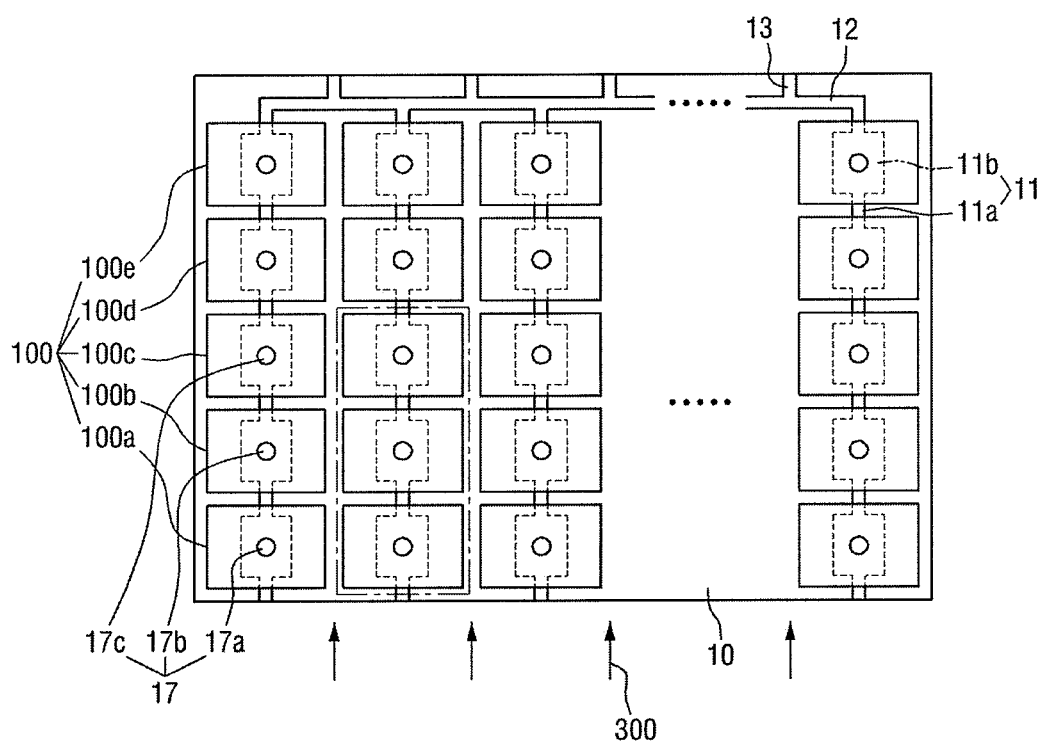
FIG. 4 is a plan view showing the flow of an encapsulant in the lower semiconductor molding die 10 during an exemplary molding process.

The effect of an exemplary embodiment of window patterns 11 of the lower semiconductor molding die 10 in accordance with principles of inventive concepts will now be described with reference to FIGS. 3 and 4. FIG. 3 is a cross-sectional view of the molding apparatus 1 during a molding process. FIG. 4 is a plan view schematically illustrating the flow of an encapsulant in the lower semiconductor molding die 10 during an exemplary molding process in accordance with principles of inventive concepts. In FIG. 4, semiconductor devices 200 respectively mounted on each of the circuit board chips 100 is omitted for clarity and ease of description.

Referring to FIG. 3, an encapsulant 300, such as an epoxy molding compound (EMC), is injected through the runner 30. In an exemplary embodiment in accordance with principles of inventive concepts, heat is applied to the encapsulant 300 before the encapsulant 300 is injected and, as a result, the encapsulant 300 is injected in a liquid state and then cured into a solid state. The injected encapsulant 300 may fill the cavity 23 to encapsulate semiconductor devices 200 mounted on respective circuit board chips 100. As indicated by arrows shown in FIG. 3, the encapsulant 300 may flow over the semiconductor device 200 and between the semiconductor device 200 and a circuit board chip 100, thereby encapsulating the semiconductor device 200. After the encapsulant 300 encapsulates the semiconductor device 200, a portion of the encapsulant 300 may flow out to the window pattern 11 through the through-hole 17, and another portion of the encapsulant 300 may move to encapsulate a next semiconductor device 201. In an exemplary embodiment in accordance with principles of inventive concepts, the window pattern 11 provides the only path through the molding apparatus 1 for air and encapsulant within the cavity 23 to be discharged (to reservoir 12 and vent 13, not shown). As a result, encapsulant 300 may completely encapsulate semiconductor devices 200 and 201 as it travels from runner 30, through cavity 23 and along window pattern 11. In particular, the window pattern 11 may be put under vacuum to encapsulate the semiconductor device 200 without voids. That is, in accordance with principles of inventive concepts, window pattern 11, particularly when placed under vacuum, can facilitate the flow of the encapsulant 300 thereby ensuring void-free encapsulation of semiconductor devices 200. Although, in this exemplary embodiment in accordance with principles of inventive concepts, encapsulant material is injected into molding apparatus 1 exclusively from a direction opposite vent(s) 13, injection from other directions, or a plurality of directions is contemplated within the scope of inventive concepts.

Referring again to FIG. 4, as described above with reference to FIG. 3, after an encapsulant encapsulates a semiconductor device on a circuit board chip 100, a portion of it may be discharged through the window pattern 11 and another portion of it may move to encapsulate another semiconductor device on a next circuit board chip 100. That is, injected encapsulant may encapsulate a semiconductor device on first circuit board chip 100a, then, a portion of the encapsulant may be discharged to the window pattern 11 through a first through-hole 17a, and another portion of the encapsulant may move to encapsulate another semiconductor device on the second circuit board chip 100b. In accordance with principles of inventive concepts, the encapsulant discharged to the window pattern 11 flows toward vent 13 via reservoir 12 along the first direction.

Similarly, after encapsulant encapsulates the semiconductor device on the second circuit board chip 100b, a portion of the encapsulant may be discharged to the window pattern 11 via a second through-hole 17b, and another portion of the encapsulant may move to the third circuit board chip 100c.

In this way, the encapsulant may sequentially mold a plurality of circuit board chips (in the order of 100a, 100b, 100c, 100d and 100e) along a direction from where it is injected (runner 30, for example) toward reservoir 12/vent 13.

In an exemplary embodiment in accordance with principles of inventive concepts, the flow of encapsulant material through window pattern 11 may be retarded relative to the flow of encapsulant material from chip 200 to chip 200 in cavity 23 above circuit board chips 100. For example, in accordance with principles of inventive concepts, window pattern 11 may include narrower passages 11a, which tend to impede the flow of encapsulant material, for example. In accordance with principles of inventive concepts, the flow rate of encapsulant material through window pattern 11 is reduced relative to the flow rate through cavity 23 above circuit board chips 100 in order to prevent void formation in the encapsulant material.

That is, voids may be formed in encapsulant material (and, ultimately, in semiconductor chip 200 encapsulant) if, for example, encapsulant material passing through a current through-hole 17a reaches a subsequent window pattern 11b before encapsulant material passing through the subsequent through-hole 17b reaches the associated subsequent window pattern 11b. By subsequent window pattern or through-hole, we mean, in this context, a window pattern or through-hole farther along the line from where the encapsulant material was injected (for example, runner 30) toward vent 13 than a current window pattern or through-hole. For example, if encapsulant material that passes through a first through-hole and through a first window pattern segment 11b were to reach a second window pattern segment 11b before encapsulant material arrived in the second window pattern segment 11b from the associated second through-hole, a void may be formed in the encapsulant material. Therefore, in accordance with principles of inventive concepts, window pattern 11 may be formed to retard the flow of encapsulant material from one window pattern segment 11b to the next and to thereby ensure that encapsulant material encapsulates all semiconductor devices along window pattern 11.

In other words, there is the potential for a situation whereby, before the injected encapsulant reaches a next circuit board chip 100 and is then discharged to a window pattern 11 through a through-hole 17, if the encapsulant discharged to a previous window pattern 11 passes under the through-hole 17, the air inside the cavity 23 may not be discharged, thus forming voids. That is, after the encapsulant encapsulates the semiconductor device on the first circuit board chip 100a, a portion of the encapsulant is discharged to a window pattern 11 through the first through-hole 17a of the first circuit board chip 100a, and the other portion of the encapsulant moves to the second circuit board chip 100b. The encapsulant that moved to the second circuit board chip 100b encapsulates the semiconductor device on the second circuit board chip 100b. Then, a portion of the encapsulant is discharged to a window pattern 11 through the second through-hole 17b, and the other portion of the encapsulant moves to the third circuit board chip 100c. The situation to be avoided is that, if the encapsulant discharged to the window pattern 11 through the first through-hole 17a passes through the window pattern 11 under the second through-hole 17b before the encapsulant is discharged to the window pattern 11 through the second through-hole 17b, the air existing on the second circuit board chip 100b may not be discharged to the window pattern 11, thus forming voids. To prevent the formation of the voids, the encapsulant discharged to the window pattern 11 through the first through-hole 17a should not reach the window pattern 11 under the second through-hole 17b before the encapsulant is discharged to the window pattern 11 through the second through-hole 17b. In accordance with principles of inventive concepts, the window pattern 11 retards the flow of encapsulant flow so that encapsulant discharged through the first through-hole 17a does not reach the window pattern 11 under the second through-hole 17b before encapsulant is discharged to the window pattern 11 through the second through-hole 17b.

An exemplary embodiment of first and second passage patterns 11a and 11b (also referred to herein as first and second passage pattern segments 11a and 11b) in accordance with principles of inventive concepts will now be described in greater detail with reference to FIGS. 5 and 6, which are enlarged views of a portion A shown in FIG. 2.

Figure 5:
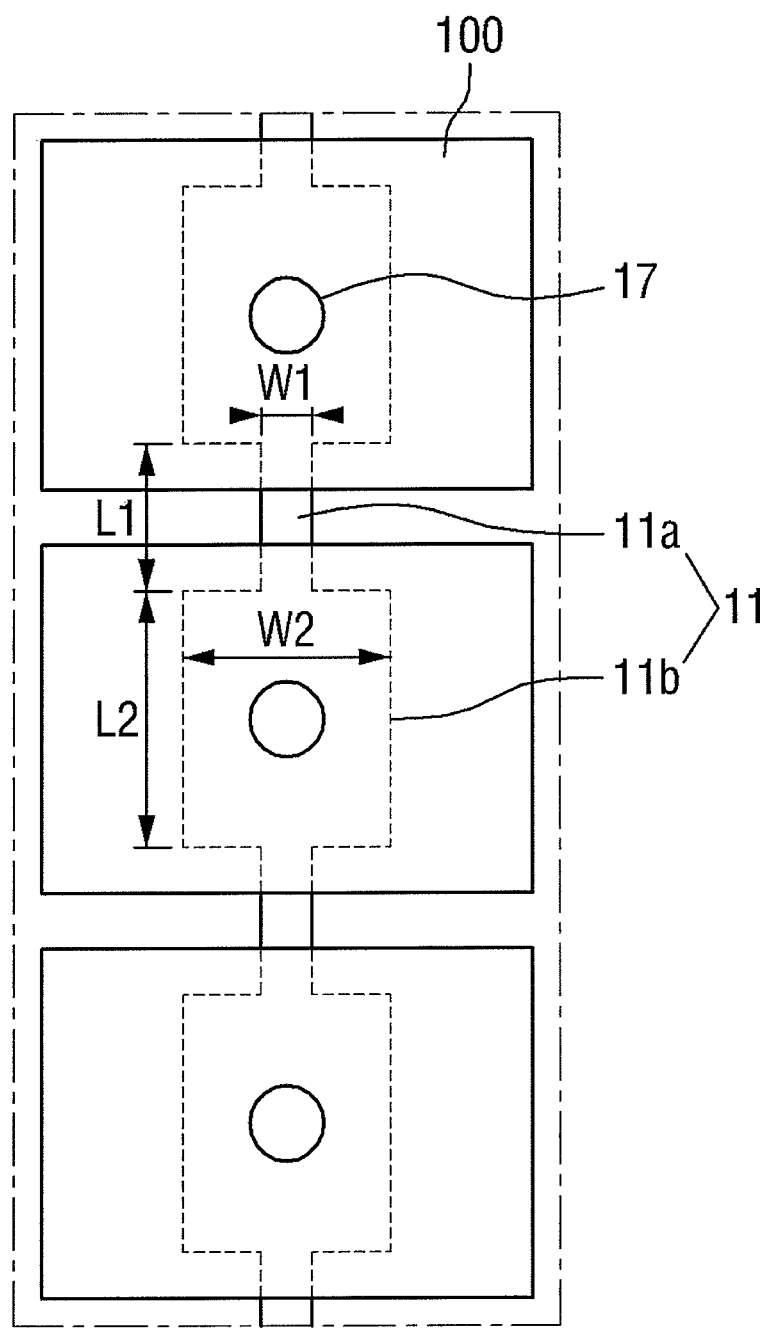
FIGS. 5 and 6 are enlarged views of a portion A shown in FIG. 2.

Referring to FIG. 5, in accordance with principles of inventive concepts, the first passage pattern 11a and the second passage pattern 11b may be of different widths. In an exemplary embodiment in accordance with principles of inventive concepts, the first passage pattern 11a may have a first width W1, and the second passage pattern 11b may have a second width W2, with the second width W2 greater than the first width W1, as shown in FIG. 5. Due to the difference between the first and second widths W1 and W2, the flow, or volume, velocity of an encapsulant flowing through a plurality of window patterns 11 during a molding process may be reduced, particularly as the encapsulant passes through narrower passage 11a, and the reduced volume velocity may prevent the formation of voids in a semiconductor package. As a result, in accordance with principles of inventive concepts, a semiconductor package with improved reliability may be fabricated.

In an exemplary embodiment in accordance with principles of inventive concepts, the first passage pattern 11a and the second passage pattern 11b may have equal or different lengths, respectively first length L1 and second length L2, with L1 greater than L2, L2 greater than L1, or L1 equal to L2, for example.

In an exemplary embodiment in accordance with principles of inventive concepts, in which the first length L1 of the first passage pattern 11a is greater than the second length L2 of the second passage pattern 11b, the encapsulant can flow to the first passage pattern 11a only after completely filling the second passage pattern 11b. Thus, the flow volume velocity of the encapsulant through the window pattern 11 may be further reduced further.

A second passage pattern 11b may be located adjacent to each through-hole 17 and a first passage pattern 11a connected to the second passage pattern 11b may be disposed at an end of each circuit board chip 100. In an exemplary embodiment in accordance with principles of inventive concepts, the first passage pattern 11a may be disposed adjacent to each through-hole 17, and the second passage pattern 11b may be disposed at an end of each circuit board chip 100. If the second passage pattern 11b is disposed adjacent to each through-hole 17 and if the first passage pattern 11a is disposed adjacent to an end of each circuit board chip 100, the encapsulant may flow to a next circuit board chip 100 only after completely filling the second passage pattern 11b. This increases the time required for the encapsulant to move to the next circuit board chip 100, thereby effectively preventing the formation of voids in encapsulant.

Figure 6:
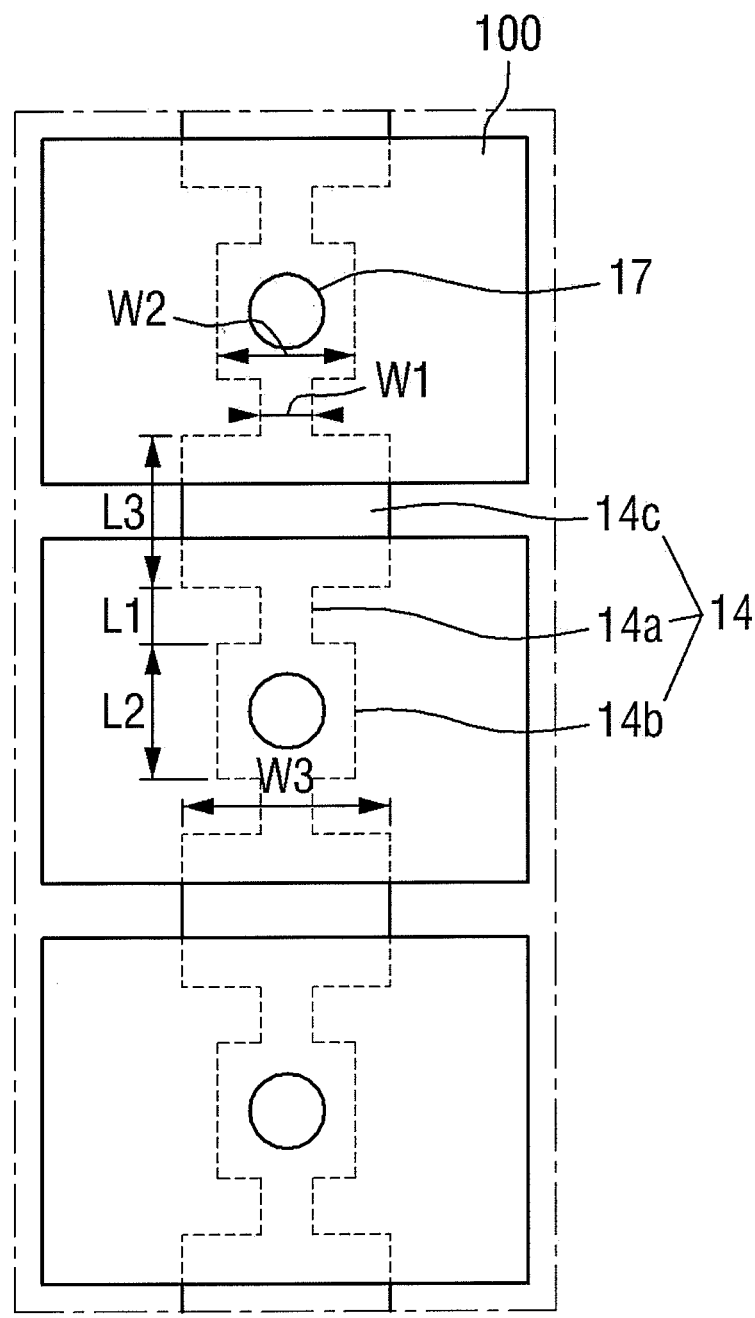

Referring to FIG. 6, an exemplary embodiment of a window pattern 14 in accordance with principles of inventive concepts may include a third passage pattern 14c. In this exemplary embodiment, the third passage pattern 14c has a third width W3 and a third length L3. The third width W3 may be greater than a second width W2 of a second passage pattern 14b, for example. In other words, the width may be greater in the order of W3>W2>W1. In addition, L1 through L3 may be different. For example, the first through third passage patterns 14a through 14c may be longer in the order of, but not limited to, L3>L2>L1.

The third passage pattern 14c may be disposed at an end of each circuit board chip 100 under each circuit board chip 100. In an exemplary embodiment in accordance with principles of inventive concepts, the second passage pattern 14b may be disposed adjacent to each through-hole 17, the third passage pattern 14c may be disposed at an end of each circuit board chip 100, and the first passage pattern 14a may be disposed between the second passage pattern 14b and the third passage pattern 14c and connected to the second passage pattern 14b and the third passage pattern 14c. In an exemplary embodiment in accordance with principles of inventive concepts in which the third passage pattern 14c is disposed at an end of each circuit board chip 100, the time required for an encapsulant to reach the second passage pattern 14b of a next circuit board chip 100 can be increased in order to avoid the formation of voids in encapsulant material.

Figure 7:
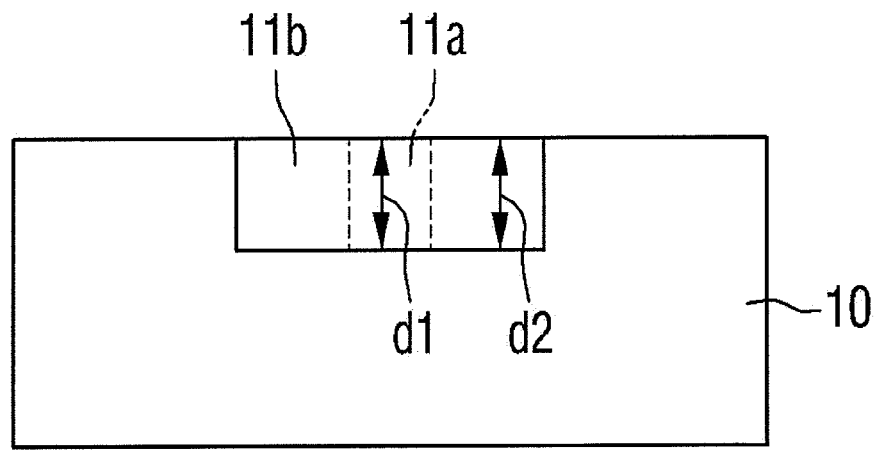
FIGS. 7, 8A and 9A are cross-sectional views taken along the line B-B of FIG. 2.
Figure 8A:
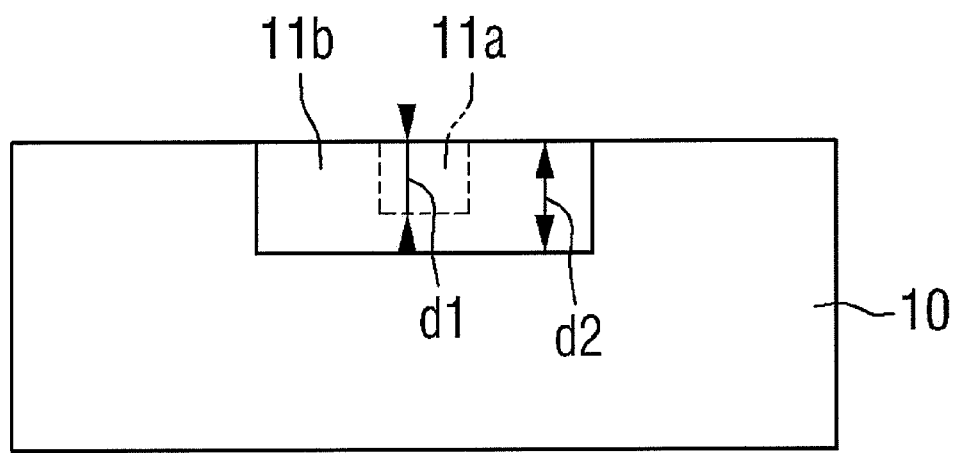
Figure 8B:
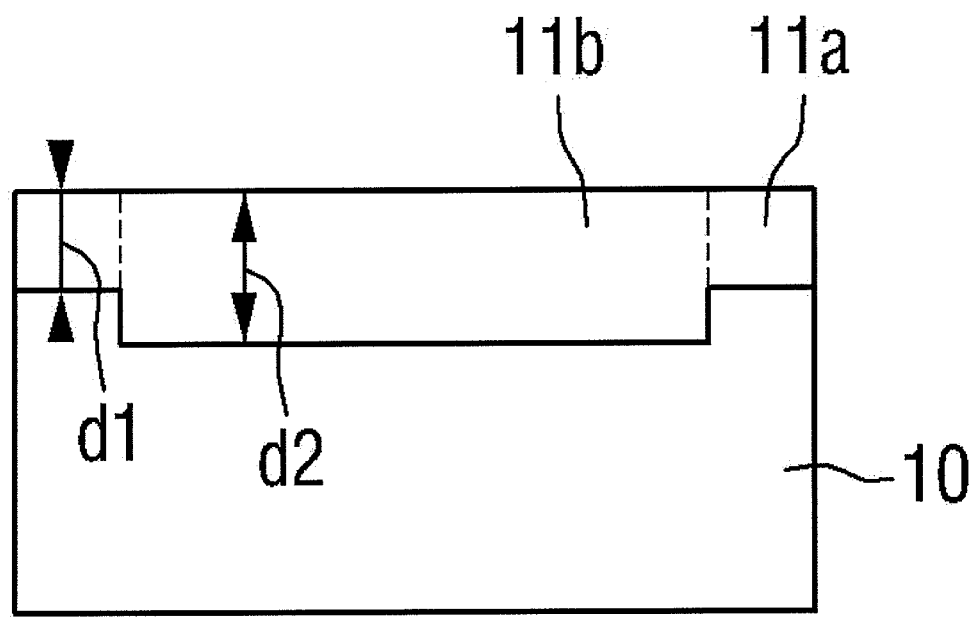
FIGS. 8B and 9B are cross-sectional views taken along the line C-C of FIG. 2.
Figure 9A:
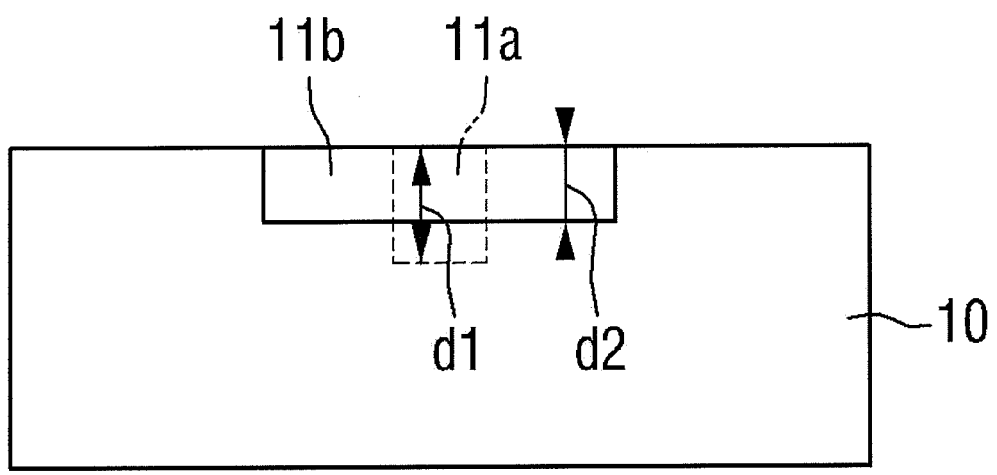
Figure 9B:
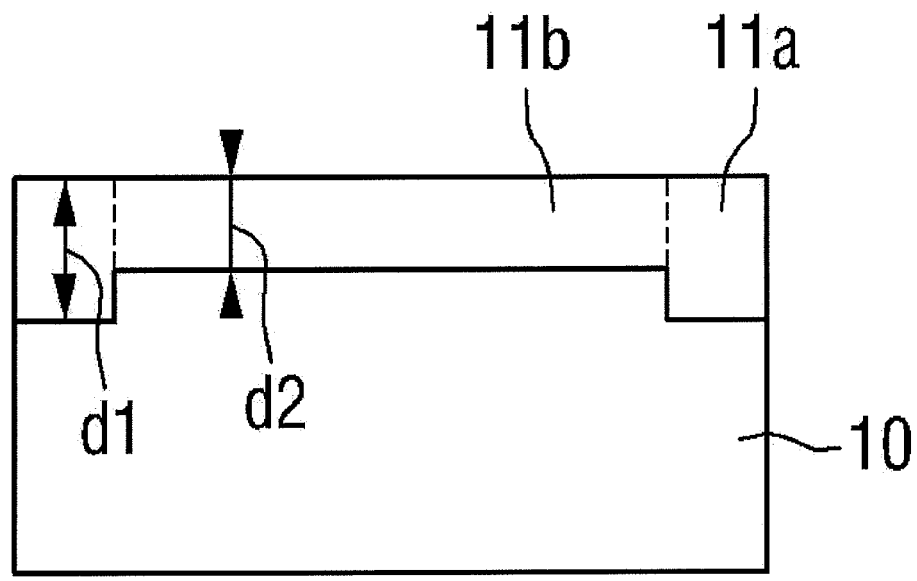

The depth of an exemplary embodiment of a window pattern in accordance with principles of inventive concepts will now be described with reference to FIGS. 7 through 9B. FIGS. 7, 8A and 9A are cross-sectional views taken along the line B-B of FIG. 2. FIGS. 8B and 9B are cross-sectional views taken along the line C-C of FIG. 2. In FIGS. 7 through 9B, a circuit board chip and a semiconductor device are omitted for clarity and ease of description.

Referring to FIG. 7, in an exemplary embodiment in accordance with principles of inventive concepts, the depth d1 of the first passage pattern 11a may be equal to the depth d2 of the second passage pattern 11b (that is, d1=d2). However, in order to retard flow of encapsulant through first passage pattern 11a, in an exemplary embodiment in accordance with principles of inventive concepts, the depth d1 of the first passage pattern 11a may be less than the depth d2 of the second passage pattern 11b, as illustrated in FIG. 8A (that is, d1<d2). In this exemplary embodiment, FIG. 8A taken along the line B-B of FIG. 2 is not different from FIG. 7. However, when the first passage pattern 11a and the second passage pattern 11b are taken along the line C-C of FIG. 2, they may be shaped as shown in FIG. 8B since d1<d2. That is, since d1<d2, the second passage pattern 11b may form a deeper groove in the lower semiconductor molding die 10 than the first passage pattern 11a.

In an exemplary embodiment in accordance with principles of inventive concepts of FIG. 9A, the depth d1 of the first passage pattern 11a may be greater than the depth d2 of the second passage pattern 11b (that is, d1>d2). In this case, FIG. 9A taken along the line B-B of FIG. 2 may not be different from FIGS. 7 and 8A except for the depth d2 of the second passage pattern 11b. However, when the first passage pattern 11a and the second passage pattern 11b are taken along the line C-C of FIG. 2, they may be shaped as shown in FIG. 9B since d1>d2. Specifically, since d1>d2, the first passage pattern 11a may form a deeper groove in the lower semiconductor molding die 10 than the second passage pattern 11b.

When the depths d1 and d2 of the first and second passage patterns 11a and 11b are different, the flow, or volume, velocity of the encapsulant may be reduced. In exemplary embodiments in accordance with principles of inventive concepts, the depth of the window pattern 11 may vary, for example, according to the viscosity of the encapsulant, the type and/or intended use of a semiconductor package being encapsulated, or the method of fabricating a lower semiconductor molding die, for example.

In exemplary embodiments in accordance with principles of inventive concepts of FIGS. 2 through 9B, the window pattern 11 has a linear shape. However, the shape of the window pattern 11 is not limited to the linear shape. For example, the window pattern 11 may have a curved shape. In exemplary embodiments in accordance with principles of inventive concepts with the first and second passage patterns 11a and 11b different in width, length and thickness, the edge and surface of the window pattern 11 various straight-line or curved shapes.

An exemplary embodiment of a semiconductor in accordance with principles of inventive concepts will now be described with reference to FIGS. 10 and 11.

Figure 10:
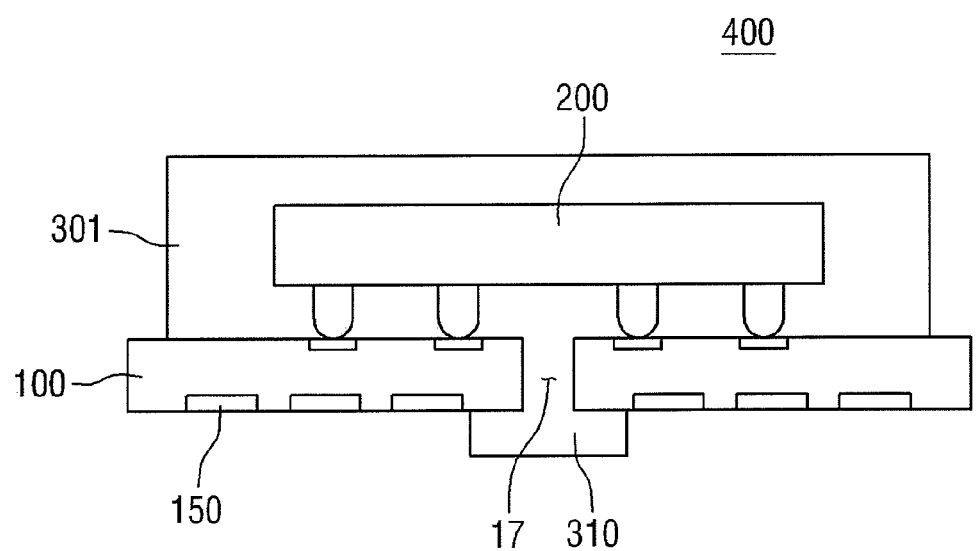
FIG. 10 is a cross-sectional view of an exemplary semiconductor package 400 formed by the exemplary molding apparatus 1 of FIG. 1.

FIG. 10 is a cross-sectional view of a semiconductor package 400 formed by the molding apparatus 1 of FIG. 1. FIG. 11 is a bottom view of an exemplary embodiment of a semiconductor package 400 in accordance with principles of inventive concepts.

The semiconductor package 400 shown in FIG. 10 may be formed by the molding apparatus 1 of FIG. 1 and may include a circuit board chip 100, a semiconductor device 200, and an encapsulant 301.

The circuit board chip 100 may include a through-hole 17 that penetrates from a top surface to a bottom surface thereof. A conductive material 150 may be patterned in the bottom surface of the circuit board chip 100 for electrical connection with other devices, such as a printed circuit board (PCB), for example. The semiconductor device 200 may be mounted on the circuit board chip 100 and may be a flip chip, for example.

The semiconductor device 200 may be encapsulated by the encapsulant 301 which protects the semiconductor device 200 from the outside environment and which dissipates heat generated by the semiconductor device 200. During a semiconductor molding process in accordance with principles of inventive concepts, the encapsulant 301 may begin in a liquid state due to the application of heat, for example and may be cured into a solid state. In exemplary embodiments in accordance with principles of inventive concepts, encapsulant 301 completely encapsulates the semiconductor device 200, fills the through-hole 17 of the circuit board chip 100, and forms a bottom surface pattern 310 of a predetermined shape in the bottom surface of the circuit board chip 100. The bottom surface pattern 310 of the encapsulant 301 results from the hardening of the encapsulant 301 that flows through a window pattern 11 when the molding process is performed using the molding apparatus 1 of FIG. 1. Because the window pattern 11 of FIG. 2 extends in the first direction, the bottom surface pattern 310 may also extend in the first direction.

An exemplary embodiment of a bottom surface pattern 310 in accordance with principles of inventive concepts will now be described in greater detail with reference to FIG. 11.

The bottom surface pattern 310 may include a first bottom surface pattern, or pattern segment, 310a and a second bottom surface pattern, or pattern segment, 310b. The first bottom surface pattern 310a corresponds to the first passage pattern 11a of FIG. 2, and the second bottom surface pattern 310b corresponds to the second passage pattern 11b of FIG. 2. Because the first passage pattern 11a and the second passage pattern 11b are connected alternately in the first direction in FIG. 2, the first bottom surface pattern 310a and the second bottom surface pattern 310b may be connected alternately to extend in the first direction.

In exemplary embodiments in accordance with principles of inventive concepts, the first bottom surface pattern 310a has a first width W4, and the second bottom surface pattern 310b has a second width W5 and the second width W5 may be greater than the first width W4, for example.

In exemplary embodiments in accordance with principles of inventive concepts, the first bottom surface pattern 310a and the second bottom surface pattern 310b may have different lengths with length L5 of the second bottom surface pattern 310b greater than length L4 of the first bottom surface pattern 310a, for example. This difference in length occurs as a result of changing the length L1 of the first passage pattern 11a and the length L2 of the second passage pattern 11b to reduce the flow velocity, or volume velocity, of an encapsulant during a semiconductor molding process in accordance with principles of inventive concepts.

Figure 11:
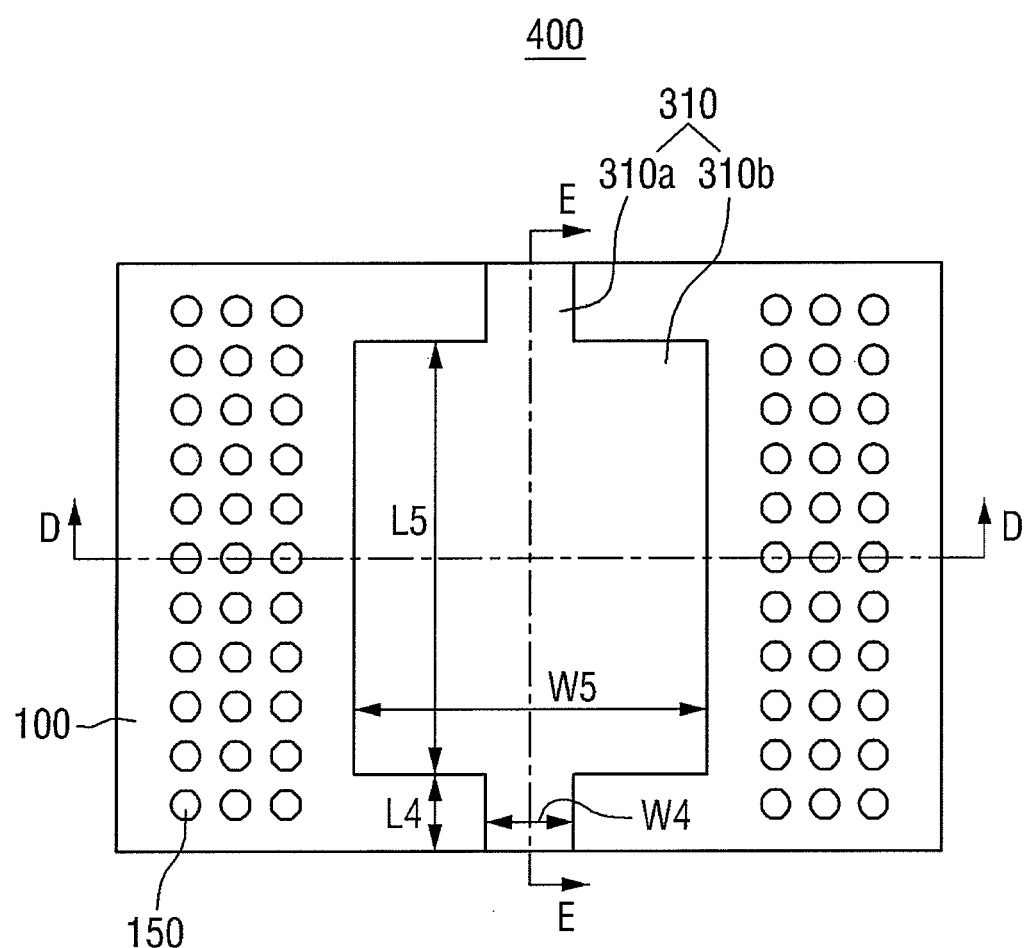
FIG. 11 is a bottom view of the semiconductor package 400 in accordance with principles of inventive concepts.

In the exemplary embodiment in accordance with principles of inventive concepts of FIG. 11, one second bottom surface pattern 310b is illustrated, but a plurality of second bottom surface patterns 310b formed in a bottom surface of the semiconductor package 400 is contemplated within the scope of inventive concepts.

The shape of another exemplary bottom surface pattern 311 in accordance with principles of inventive concepts will now be described with reference to FIG. 12, which is 12 is a bottom view of a semiconductor package 401 in accordance with principles of inventive concepts.

Figure 12:
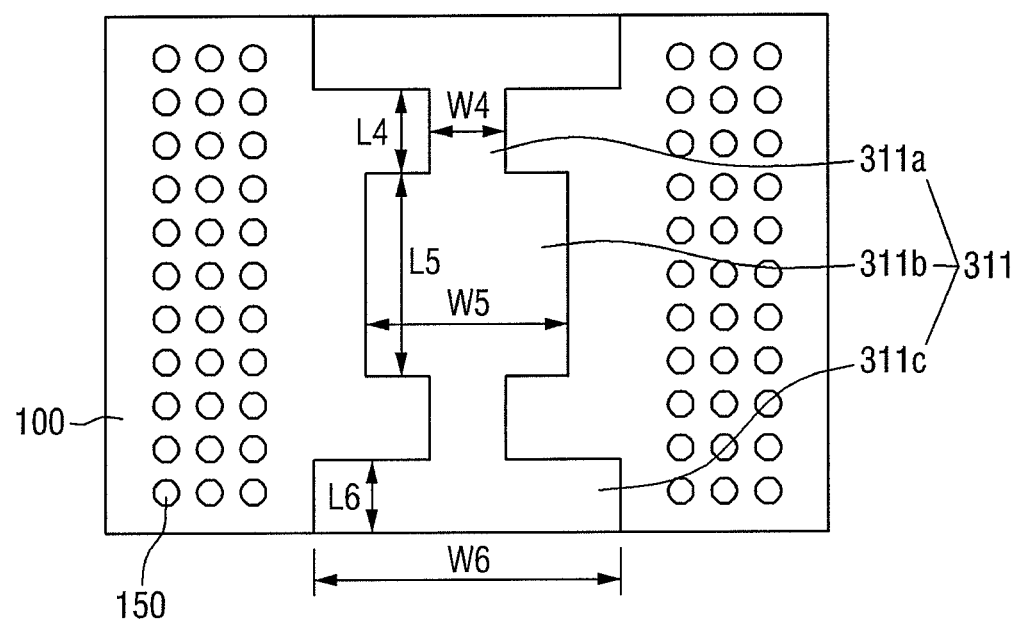
FIG. 12 is a bottom view of a semiconductor package 401 in accordance with principles of inventive concepts.

Referring to FIG. 12, the bottom surface pattern 311 may include a third bottom surface pattern 311c. In this exemplary embodiment in accordance with principles of inventive concepts, the third bottom surface pattern 311c has a third width W6 and a third length L6 and third width W3 may be greater than a second width W5 of a second bottom surface pattern 311b. That is, the widths may be greater in the order of W6>W5>W4, for example. Additionally, in this exemplary embodiment in accordance with principles of inventive concepts, lengths L4 through L6 may be different, with the first through third bottom surface patterns 311a through 311c longer in the order of L6>L5>L4, for example.

In exemplary embodiments in accordance with principles of inventive concepts, the third bottom surface pattern 311c may be disposed at an end of the circuit board chip 100 under the circuit board chip 100. In particular, the second bottom surface pattern 311b may be disposed adjacent to a through-hole 17, the third bottom surface pattern 311c may be disposed at an end of the circuit board chip 100, and the first bottom surface pattern 311a may be disposed between the second bottom surface pattern 311b and the third bottom surface pattern 311c to be connected to both of them, for example.

The bottom surface pattern 311 of FIG. 12 corresponds to the window pattern 14 of FIG. 6. The exemplary window pattern 14 of FIG. 6 has a shape for reducing the volume velocity of an encapsulant that flows in the window pattern 14. When encapsulant hardens within the window pattern 14, the bottom surface pattern 311 of the semiconductor package 401 may be shaped as shown in FIG. 12.

Exemplary bottom surface patterns in accordance with principles of inventive concepts and, in particular, the depth such a bottom surface pattern, will now be described with reference to FIGS. 13A through 15B.

Figure 13A:
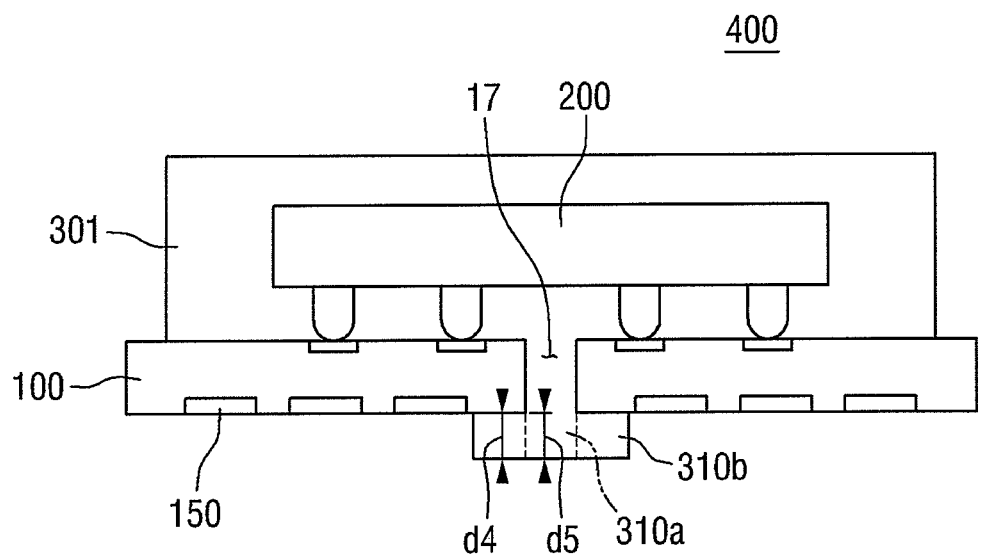
FIGS. 13A, 14A and 15A are cross-sectional views taken along the line D-D of FIG. 11.
Figure 13B:
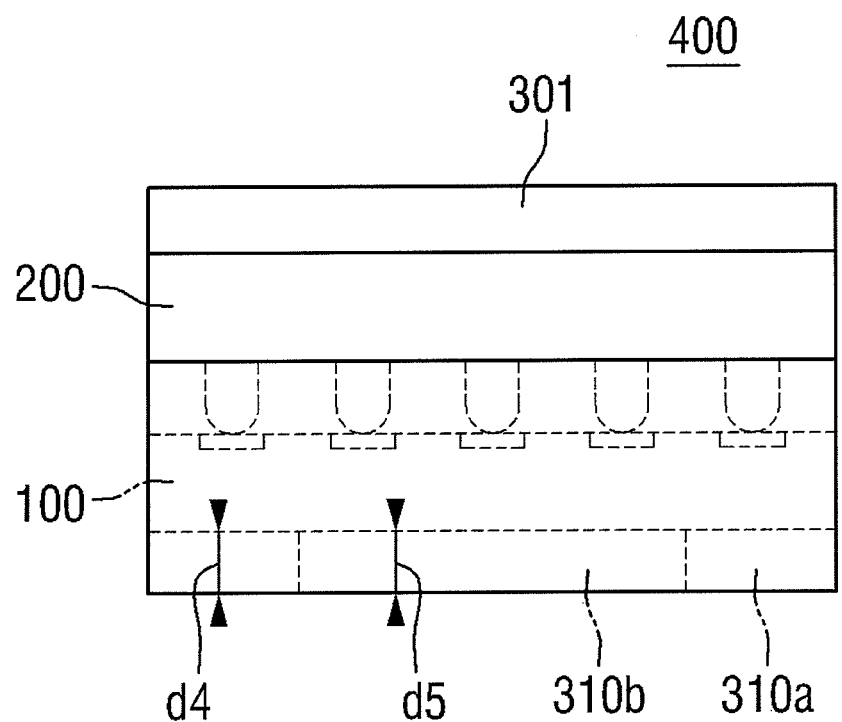
FIGS. 13B, 14B, and 15B are cross-sectional views taken along the line E-E of FIG. 11.
Figure 14A:
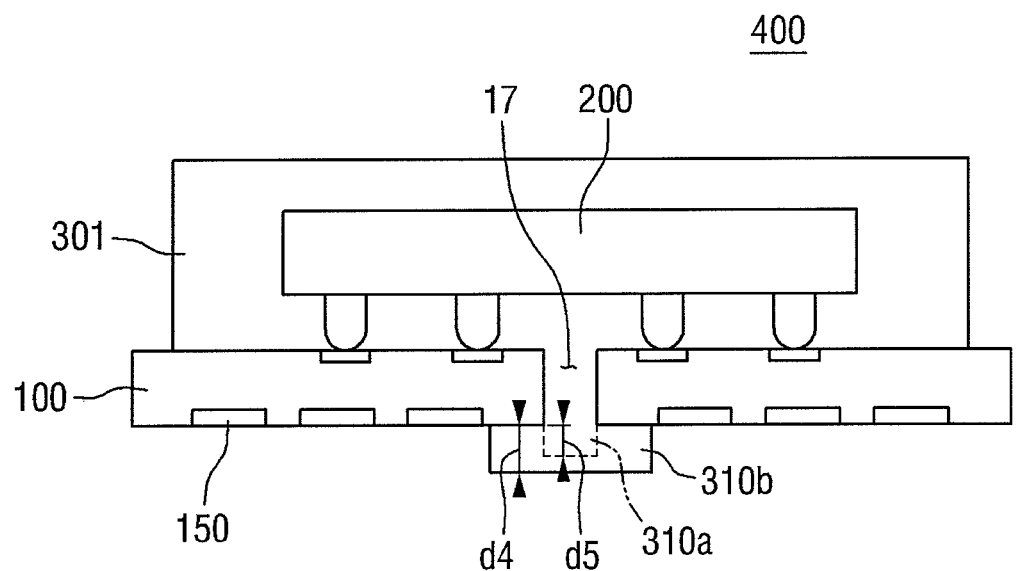
Figure 14B:
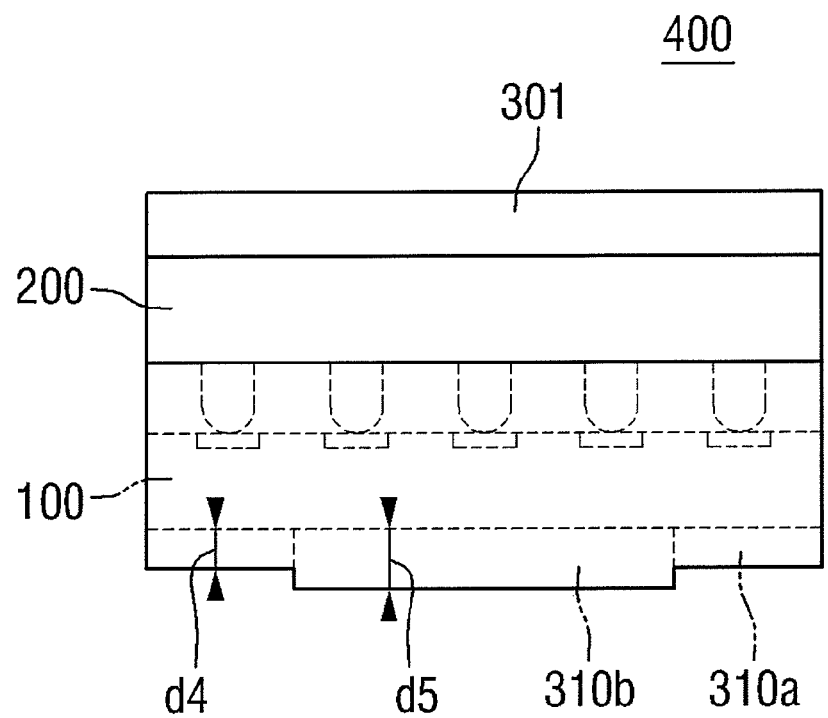
Figure 15A:
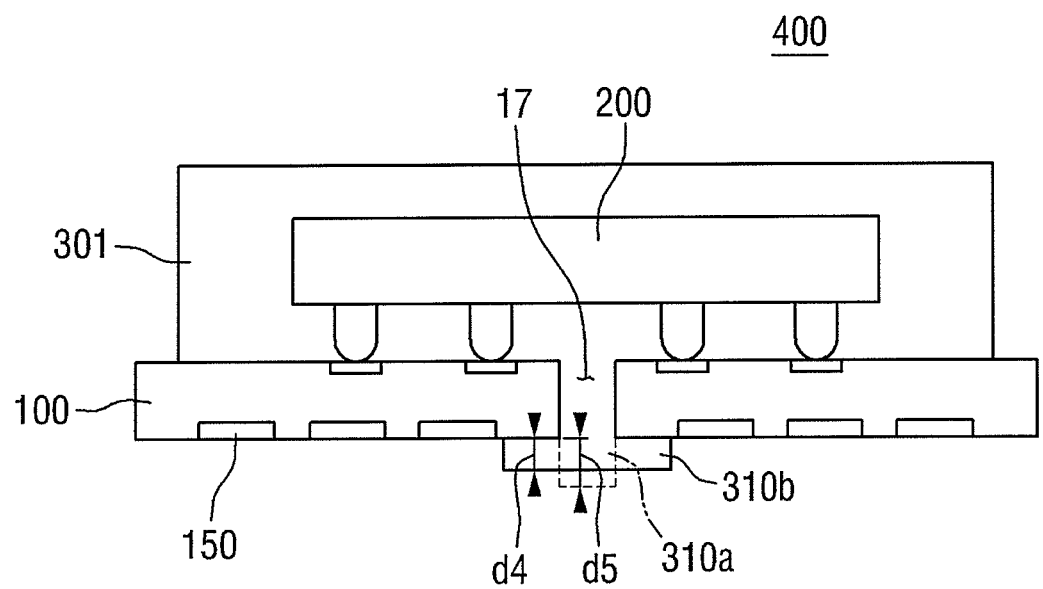
Figure 15B:
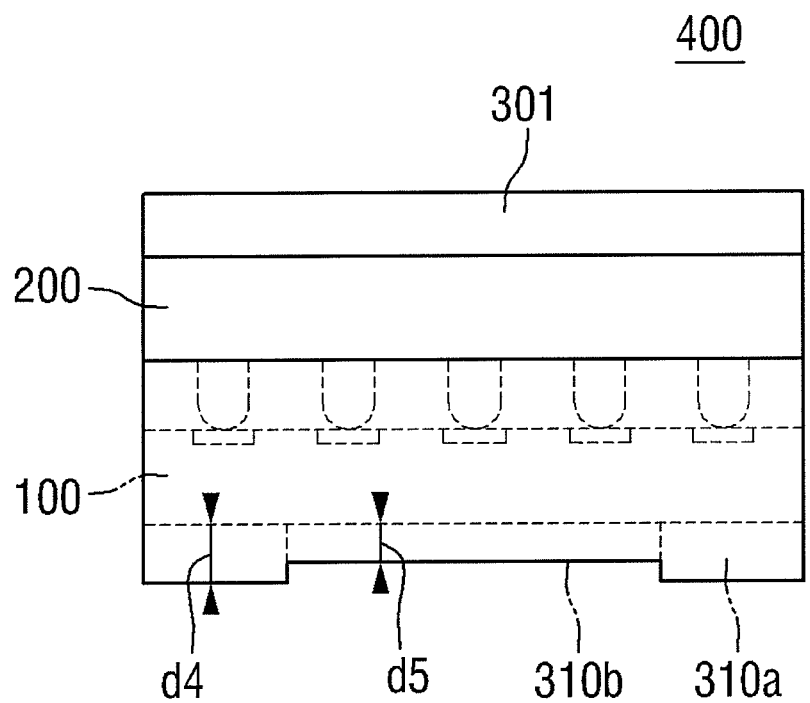

FIGS. 13A, 14A and 15A are cross-sectional views taken along the line D-D of FIG. 11. FIGS. 13B, 14B, and 15B are cross-sectional views taken along the line E-E of FIG. 11.

Referring to FIG. 13A, in exemplary embodiments in accordance with principles of inventive concepts, depth d4 of the first bottom surface pattern 310a may be equal to a depth d5 of the second passage pattern 310b (d4=d5). In such an exemplary embodiment, a cross-sectional view taken along the line E-E of FIG. 11 may be as shown in FIG. 13B.

The depth d4 of the first bottom surface pattern 310a may also be different from the depth d5 of the second bottom surface pattern 310b. Referring to FIG. 14A, in an exemplary embodiment, the depth d4 of the first bottom surface pattern 310a may be less than the depth d5 of the second bottom surface pattern 310b (d4<d5). In such an exemplary embodiment, FIG. 14A taken along the line D-D of FIG. 11 may not be different from FIG. 13A except for the depth d4. However, when the first bottom surface pattern 310a and the second bottom surface pattern 310b are taken along the line E-E of FIG. 11, they may be shaped as shown in FIG. 14B since d4<d5. In particular, since d4<d5, the second bottom surface pattern 310b may be formed thicker in the bottom surface of the circuit board chip 100 than the first bottom surface pattern 310a.

Referring to FIG. 15A, in an exemplary embodiment, the depth d4 of the first bottom surface pattern 310a may be greater than the depth d5 of the second bottom surface pattern 310b (d4>d5). In such an exemplary embodiment, FIG. 15A taken along the line D-D of FIG. 11 may not be different from FIGS. 13A and 14A except for the depth d4. However, when the first bottom surface pattern 310a and the second bottom surface pattern 310b are taken along the line E-E of FIG. 11, they may be shaped as shown in FIG. 15B since d4>d5. In particular, since d4>d5, the first bottom surface pattern 310a may be thicker than the second bottom surface pattern 310b and the bottom surface pattern 310 formed in the bottom surface of the circuit board chip 100 may be depressed in the center thereof.

The bottom pattern 310 of the circuit board chip 100 corresponds to a window pattern of a lower semiconductor molding die. In this exemplary embodiment in accordance with principles of inventive concepts the shape of the window pattern is designed to reduce the flow velocity, or volume velocity, of an encapsulant. Accordingly, this may create a difference between the depth d4 of the first bottom surface pattern 310a and the depth d5 of the second bottom surface pattern 310b.

The above description has been focused on the difference between the depths d4 and d5 of the first bottom surface pattern 310a and the second bottom surface pattern 310b. The depth of the bottom surface pattern 310 is not fixed but may vary according to the shape of the window pattern, for example. Additionally, the bottom surface pattern 310 may be etched to facilitate the electrical connection of the conductive material 150 located in the bottom surface of the circuit board chip 100, for example, and in an exemplary embodiment, once the bottom surface pattern 310 etched, there is no difference between the depths d4 and d5 of the first and second bottom surface patterns 310a and 310b. Therefore, the first and second bottom surface patterns 310a and 310b may be shaped as shown in FIGS. 13A and 13B, for example. In exemplary embodiments in accordance with principles of inventive concepts, the first bottom surface pattern 310a and the second bottom surface pattern 310b may also have different thicknesses, depending on the type and method of the etching process.

An exemplary method of fabricating a semiconductor package in accordance with principles of inventive concepts will be described with reference to FIGS. 16 and 2 through 9B.

Figure 16:
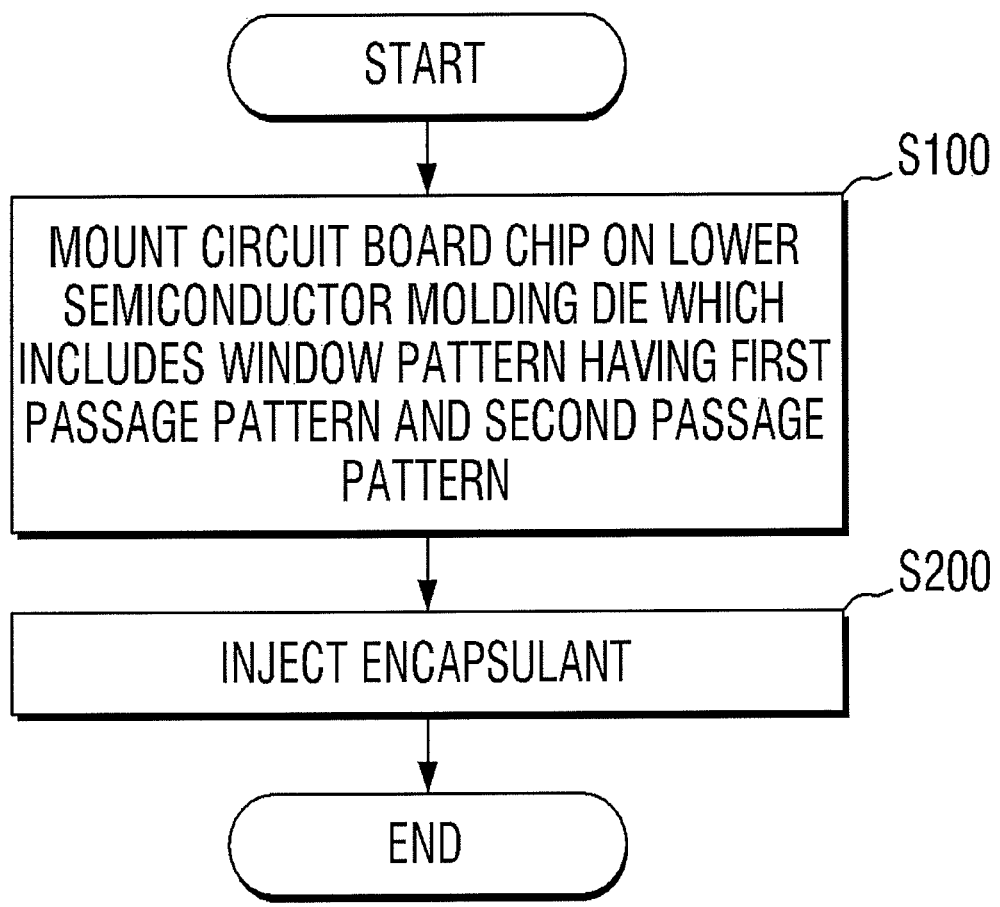
FIG. 16 is a flowchart illustrating an exemplary method of fabricating a semiconductor package in accordance with principles of inventive concepts.

FIG. 16 is a flowchart illustrating an exemplary method of fabricating a semiconductor package in accordance with principles of inventive concepts. For simplicity and clarity of description, a redundant description of elements and features described above will be omitted below.

Referring to FIG. 16, a circuit board chip is mounted on a lower semiconductor molding die which includes a window pattern having a first passage pattern and a second passage pattern (operation S100). Referring to FIGS. 2 and 3, each of a plurality of circuit board chips 100 may include a through-hole 17 employed to discharge encapsulant material subsequently, and a semiconductor device 200 may be mounted on each of the circuit board chips 100.

In exemplary an embodiment in accordance with principles of inventive concepts, lower semiconductor molding die 10 includes a window pattern 11, where excess encapsulant may be discharged. The window pattern 11 may be disposed under the through-hole 17 of each of the circuit board chips 100 and extend in a first direction and may be aligned with the through-hole 17, for example. The window pattern 11 may include a first passage pattern 11a and a second passage pattern 11b and the first passage pattern 11a and the second passage pattern 11b may be connected alternately in the first direction.

The first passage pattern 11a and the second passage pattern 11b may have different shapes, as described above. In particular, a first width W1 of the first passage pattern 11a may be smaller than a second width W2 of the second passage pattern 11b, for example. Additionally, a second length L2 of the second passage pattern 11b may be greater than a first length L1 of the first passage pattern 11a.

Referring to FIGS. 7 through 9B, the first passage pattern 11a and the second passage pattern 11b may also be of different depths. For example, d1 and d2 may be equal as shown in FIG. 7, d2 may be greater than d1 as shown in FIGS. 8A and 8B, or d1 may be greater than d2 as shown in FIGS. 9A and 9B.

A described above, when the first passage pattern 11a and the second passage pattern 11b have different shapes, the volume velocity of encapsulant flowing through the window pattern 11 can be reduced and, as a result, void-formation in encapsulant material may be avoided in accordance with principles of inventive concepts.

Referring back to FIG. 16, after the circuit board chip is mounted on the lower semiconductor molding die, an encapsulant, which may be heated to a liquid state, may be injected into a molding apparatus 1 (operation S200). Molding apparatus 1 may also be heated to maintain encapsulant in a liquid state during an exemplary encapsulation process. Referring to FIGS. 4 and 5, an encapsulant 300 is injected into a cavity 23 through a runner 30 to encapsulate semiconductor devices 200 mounted on each of the circuit bard chips 100. While encapsulating the semiconductor device 200, the encapsulant 300 fills the through-hole 17. After the encapsulant 300 fills the through-hole 17, excess encapsulant is discharged to the window pattern 11. The encapsulant 300 discharged to the window pattern 11 flows through the first passage pattern 11a and the second passage pattern 11b.

Once the encapsulant 300 encapsulates the semiconductor device 200 and completely fills the cavity 23, the injection of the encapsulant 300 is stopped. Then, the temperature is lowered, allowing the encapsulant 300 to transform from liquid state to the solid state. When the encapsulant 300 becomes completely solid, the circuit board chips 100 are separated from each other.

Those skilled in the art will appreciate that variations and modifications can be made to describe exemplary embodiments without departing from the principles of inventive concepts. The forgoing description is to be used for illustration, not for purposes of limitation.

What is claimed is:

1. A semiconductor package molding die comprising:
   a mounting surface configured for receiving a plurality of circuit board chips, each having a through-hole; and
   a plurality of window patterns, each aligned with the through-hole of a circuit board chip, each window pattern extending in a first direction under a corresponding one of the circuit board chips,
   wherein each of the window patterns comprises a first passage pattern having a first width and a second passage pattern having a second width different from the first width, wherein the second width is greater than the first width and the second passage pattern is deeper than the first passage pattern.

2. The molding die of claim 1, further configured for receiving an encapsulant which fills the through-hole and the window patterns.

3. The molding die of claim 1, wherein the first passage pattern and the second passage pattern are connected alternately in the first direction.

4. The molding die of claim 1, wherein the second passage pattern is longer than the first passage pattern.

5. The molding die of claim 4, wherein the first passage pattern is disposed adjacent to an end of each of the circuit board chips, and the second passage pattern is disposed adjacent to the through-hole of each of the circuit board chips.

6. The molding die of claim 1, wherein each of the window patterns further comprises a third passage pattern having a third width greater than the second width, wherein the third passage pattern is disposed adjacent to an end of each of the circuit board chips, the second passage pattern is disposed adjacent to the through-hole, and the first passage pattern is disposed between the second passage pattern and the third passage pattern.

7. A semiconductor package comprising:
   a circuit board chip having a through-hole;
   a semiconductor device mounted on the circuit board chip; and
   an encapsulant,
   wherein the encapsulant encapsulates the semiconductor device, fills the through-hole, extends in a bottom surface of the circuit board chip in a first direction, and comprises a first bottom surface pattern having a first width and a second bottom surface pattern having a second width different from the first width, wherein the second width is greater than the first width and the second bottom surface pattern is thicker than the first bottom surface pattern.

8. The semiconductor package of claim 7, wherein the first bottom surface pattern and the second bottom surface pattern are connected alternately in the first direction.

9. The semiconductor package of claim 7, wherein the second bottom surface pattern is longer than the first bottom surface pattern.

10. The semiconductor package of claim 9, wherein the first bottom surface pattern is disposed adjacent to an end of the circuit board chip, and the second bottom surface pattern is disposed adjacent to the through-hole.

11. The semiconductor package of claim 7, wherein the encapsulant further comprises a third bottom surface pattern having a third width greater than the second width, wherein the third bottom surface pattern is disposed adjacent to both ends of the circuit board chip, the second bottom surface pattern is disposed adjacent to the through-hole, and the first bottom surface pattern is disposed between the second bottom surface pattern and the third bottom surface pattern.

12. A semiconductor package, comprising:
   a circuit board chip having a through-hole;
   a semiconductor device mounted on the circuit board chip; and
   an encapsulant, wherein the encapsulant encapsulates the semiconductor device, fills the through-hole and has an external pattern that is the complement of a mold within which the encapsulant was formed, the external pattern on one side of the package reflecting a mold shape that retards the flow of encapsulant material relative to the flow of encapsulant material on the opposite side of the package, wherein the external pattern on one side includes segments having different thicknesses.

13. The semiconductor package of claim 12, wherein the external pattern on one side includes segments having different widths.

14. The semiconductor package of claim 12, wherein the external pattern on one side includes a thicker segment aligned with the through-hole.

15. The semiconductor package of claim 12, wherein the external pattern on one side includes a wider segment aligned with the through-hole.

* * * * *